United States Patent
Lu et al.

(10) Patent No.: US 9,607,921 B2
(45) Date of Patent: Mar. 28, 2017

(54) PACKAGE ON PACKAGE INTERCONNECT STRUCTURE

(75) Inventors: Wen-Hsiung Lu, Jhonghe (TW); Yi-Wen Wu, Xizhi (TW); Chih-Wei Lin, Xinfeng Township (TW); Hsiu-Jen Lin, Zhubei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 655 days.

(21) Appl. No.: 13/349,405

(22) Filed: Jan. 12, 2012

(65) Prior Publication Data
US 2013/0181338 A1 Jul. 18, 2013

(51) Int. Cl.
*H01L 23/498* (2006.01)
*H01L 23/31* (2006.01)
(Continued)

(52) U.S. Cl.
CPC ...... *H01L 23/3192* (2013.01); *H01L 23/3157* (2013.01); *H01L 24/05* (2013.01); *H01L 21/56* (2013.01); *H01L 21/568* (2013.01); *H01L 23/3114* (2013.01); *H01L 24/03* (2013.01); *H01L 24/11* (2013.01); *H01L 24/13* (2013.01); *H01L 2224/02331* (2013.01);
(Continued)

(58) Field of Classification Search
CPC ......... H01L 24/11; H01L 24/12; H01L 24/13; H01L 24/14; H01L 21/568; H01L 23/3192; H01L 24/05; H01L 23/3157; H01L 2224/0401; H01L 2924/00014; H01L 2224/13111; H01L 2224/05567; H01L 2224/13022; H01L 2224/05664; H01L 2224/1191; H01L 2224/03823; H01L 2224/05166; H01L 2224/05082; H01L 2224/05147; H01L 2224/13082; H01L 2224/05548; H01L 2224/02331; H01L 24/03; H01L 2224/05647; H01L 2224/05564; H01L 2224/13147; H01L 2224/05547; H01L 2224/05186; H01L 2224/05008; H01L 2224/05181; H01L 2224/11464; H01L 2224/05611; H01L 2224/05655; H01L 2224/73104
USPC ......................................................... 257/737
See application file for complete search history.

(56) References Cited

U.S. PATENT DOCUMENTS 5,072,520 A 12/1991 Nelson
5,317,801 A 6/1994 Tanaka et al.
(Continued)

FOREIGN PATENT DOCUMENTS

DE 102005040213 A1 3/2006
DE 112005001949 T5 5/2007
(Continued)

*Primary Examiner* — Ermias Woldegeorgis
(74) *Attorney, Agent, or Firm* — Slater Matsil, LLP (57) ABSTRACT

A structure comprises a post passivation interconnect layer formed over a semiconductor substrate, a metal bump formed over the post passivation interconnect layer and a molding compound layer formed over the semiconductor substrate. A lower portion of the metal bump is embedded in the molding compound layer and a middle portion of the metal bump is surrounded by a concave meniscus molding compound protection layer.

17 Claims, 11 Drawing Sheets

(51) Int. Cl.
*H01L 21/56* (2006.01)
*H01L 23/00* (2006.01)

(52) U.S. Cl.
CPC ............ *H01L 2224/03823* (2013.01); *H01L 2224/0401* (2013.01); *H01L 2224/05008* (2013.01); *H01L 2224/05082* (2013.01); *H01L 2224/05147* (2013.01); *H01L 2224/05166* (2013.01); *H01L 2224/05181* (2013.01); *H01L 2224/05186* (2013.01); *H01L 2224/05547* (2013.01); *H01L 2224/05548* (2013.01); *H01L 2224/05564* (2013.01); *H01L 2224/05567* (2013.01); *H01L 2224/05611* (2013.01); *H01L 2224/05647* (2013.01); *H01L 2224/05655* (2013.01); *H01L 2224/05664* (2013.01); *H01L 2224/1191* (2013.01); *H01L 2224/11464* (2013.01); *H01L 2224/13022* (2013.01); *H01L 2224/13082* (2013.01); *H01L 2224/13111* (2013.01); *H01L 2224/13147* (2013.01); *H01L 2224/73104* (2013.01); *H01L 2924/00014* (2013.01); *H01L 2924/181* (2013.01)

(56) References Cited

U.S. PATENT DOCUMENTS

| | | |
|---|---|---|
| 5,869,904 A | 2/1999 | Shoji |
| 6,037,065 A | 3/2000 | Hajmrle et al. |
| 6,158,644 A | 12/2000 | Brofman et al. |
| 6,187,615 B1 | 2/2001 | Kim et al. |
| 6,365,978 B1 | 4/2002 | Ibnabdeljalil et al. |
| 6,369,451 B2 | 4/2002 | Lin |
| 6,425,516 B1 | 7/2002 | Iwatsu et al. |
| 6,586,322 B1 | 7/2003 | Chiu et al. |
| 6,643,923 B1 | 11/2003 | Hishinuma et al. |
| 6,664,637 B2 | 12/2003 | Jimarez et al. |
| 6,933,613 B2 | 8/2005 | Akashi |
| 6,940,169 B2 | 9/2005 | Jin et al. |
| 7,187,068 B2 | 3/2007 | Suh et al. |
| 7,372,151 B1 | 5/2008 | Fan et al. |
| 7,749,882 B2 | 7/2010 | Kweon et al. |
| 7,977,783 B1 | 7/2011 | Park et al. |
| 8,264,089 B2 | 9/2012 | Alvarado et al. |
| 8,345,435 B2 | 1/2013 | Hamatani et al. |
| 8,362,612 B1 | 1/2013 | Paek et al. |
| 8,624,392 B2 | 1/2014 | Yew et al. |
| 8,735,273 B2 | 5/2014 | Lu et al. |
| 2001/0050434 A1 | 12/2001 | Kaneda et al. |
| 2002/0001937 A1 | 1/2002 | Kikuchi et al. |
| 2002/0031868 A1 | 3/2002 | Capote et al. |
| 2002/0167077 A1 | 11/2002 | Vincent |
| 2003/0068847 A1 | 4/2003 | Watanabe et al. |
| 2003/0096453 A1 | 5/2003 | Wang et al. |
| 2003/0153172 A1* | 8/2003 | Yajima .................... H01L 22/34 438/612 |
| 2004/0012930 A1 | 1/2004 | Grigg |
| 2004/0027788 A1 | 2/2004 | Chiu et al. |
| 2004/0072387 A1 | 4/2004 | Hong et al. |
| 2004/0266162 A1 | 12/2004 | Feng |
| 2005/0080956 A1 | 4/2005 | Zaudtke et al. |
| 2006/0038291 A1 | 2/2006 | Chung et al. |
| 2006/0063378 A1* | 3/2006 | Lin ...................... H01L 21/768 438/642 |
| 2006/0189114 A1* | 8/2006 | Seto ........................ H01L 24/11 438/597 |
| 2007/0045840 A1 | 3/2007 | Varnau |
| 2007/0102815 A1 | 5/2007 | Kaufmann et al. |
| 2007/0108573 A1 | 5/2007 | Chung et al. |
| 2007/0176290 A1 | 8/2007 | Park et al. |
| 2007/0184577 A1 | 8/2007 | Chung et al. |
| 2007/0187825 A1 | 8/2007 | Hashimoto |
| 2007/0267745 A1 | 11/2007 | Chao et al. |
| 2008/0001290 A1 | 1/2008 | Chou et al. |
| 2008/0150134 A1 | 6/2008 | Shinkai et al. |
| 2008/0308935 A1 | 12/2008 | Kim et al. |
| 2009/0020864 A1 | 1/2009 | Pu et al. |
| 2009/0045513 A1* | 2/2009 | Kim ..................... H01L 21/568 257/738 |
| 2009/0052218 A1 | 2/2009 | Kang |
| 2009/0120215 A1 | 5/2009 | Jacobson et al. |
| 2009/0130840 A1* | 5/2009 | Wang ................ H01L 23/49816 438/614 |
| 2009/0140442 A1 | 6/2009 | Lin |
| 2009/0140942 A1 | 6/2009 | Mikkola et al. |
| 2009/0146317 A1* | 6/2009 | Shih ........................ H01L 24/11 257/778 |
| 2009/0206479 A1 | 8/2009 | Daubenspeck et al. |
| 2009/0314519 A1 | 12/2009 | Soto et al. |
| 2010/0065966 A1 | 3/2010 | Pendse et al. |
| 2010/0078772 A1 | 4/2010 | Robinson |
| 2010/0096754 A1 | 4/2010 | Lee et al. |
| 2010/0140760 A1 | 6/2010 | Tam et al. |
| 2011/0037158 A1* | 2/2011 | Youn ....................... H01L 23/50 257/686 |
| 2011/0080713 A1 | 4/2011 | Sunohara |
| 2011/0101520 A1 | 5/2011 | Liu et al. |
| 2011/0108983 A1* | 5/2011 | Lu ........................... H01L 24/05 257/738 |
| 2011/0278739 A1 | 11/2011 | Lai et al. |
| 2012/0006592 A1 | 1/2012 | Ouchi et al. |
| 2012/0199959 A1 | 8/2012 | Hart |
| 2012/0199991 A1 | 8/2012 | Okamoto et al. |
| 2012/0261817 A1 | 10/2012 | Do et al. |
| 2013/0009307 A1 | 1/2013 | Lu et al. |
| 2013/0105971 A1 | 5/2013 | Daubenspeck et al. |
| 2013/0147031 A1 | 6/2013 | Chen et al. |
| 2013/0168850 A1 | 7/2013 | Samoilov et al. |
| 2013/0181338 A1 | 7/2013 | Lu et al. |
| 2014/0054764 A1 | 2/2014 | Lu et al. |
| 2014/0077361 A1 | 3/2014 | Lin et al. |
| 2014/0159223 A1 | 6/2014 | Chen et al. |
| 2014/0175639 A1 | 6/2014 | Kim et al. |
| 2014/0232017 A1 | 8/2014 | Rampley et al. |
| 2015/0123269 A1 | 5/2015 | Chen et al. |
| 2015/0137352 A1 | 5/2015 | Chen et al. |
| 2015/0235977 A1 | 8/2015 | Shao et al. |
| 2015/0243613 A1 | 8/2015 | Chen et al. |
| 2015/0262948 A1 | 9/2015 | Lu et al. |

FOREIGN PATENT DOCUMENTS

| | | |
|---|---|---|
| KR | 1020070076846 | 7/2007 |
| KR | 20090018442 A | 2/2009 |
| KR | 20090120215 A | 11/2009 |
| KR | 20100131180 A | 12/2010 |
| TW | 201246540 A | 11/2012 |

* cited by examiner

PACKAGE ON PACKAGE INTERCONNECT STRUCTURE

REFERENCE TO RELATED APPLICATIONS

This application relates to the following co-pending and commonly assigned patent applications: Ser. No. 13/751,289, filed Jan. 28, 2013, entitled "System and Method for an Improved Fine Pitch Joint;" Ser. No. 13/838,748, filed Mar. 15, 2013, entitled "Interconnect Structures and Methods of Forming Same;" Ser. No. 13/868,554, filed Apr. 23, 2013, entitled "Apparatus and Method for Wafer Separation;" Ser. No. 13/913,599, filed Jun. 10, 2013, entitled "Interconnect Joint Protective Layer Apparatus and Method;" Ser. No. 13/914,426, filed Jun. 10, 2013, entitled "Interconnect Structures and Methods of Forming Same;" Ser. No. 13/934,562, filed Jul. 3, 2013, entitled "Packaging Devices, Methods of Manufacture Thereof, and Packaging Methods" and Ser. No. 13/939,966, filed Jul. 11, 2013, entitled "Apparatus and Method for Package Reinforcement."

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps. Much higher density can be achieved by employing chip-scale packaging based semiconductor devices. Furthermore, chip-scale packaging based semiconductor devices can achieve smaller form factors, cost-effectiveness, increased performance and lower power consumption.

A chip-scale packaging based semiconductor device may comprise a plurality of solder balls formed on a plurality of under bump metal (UBM) openings of a semiconductor die. Alternatively copper bumps may be employed to electrically connect the semiconductor device with a substrate such as a packaging substrate, a printed circuit board (PCB), another die/wafer or the like.

The chip-scale packaging technology has some advantages. One advantageous feature of chip-scale packaging is that chip-scale packaging techniques may reduce fabrication costs. Another advantageous feature of chip-scale packaging based multi-chip semiconductor devices is that parasitic losses are reduced by employing bumps sandwiched between a semiconductor device and a packaging substrate.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a package on package interconnect structure. The disclosure may also be applied, however, to a variety of semiconductor devices.

Figure 1:
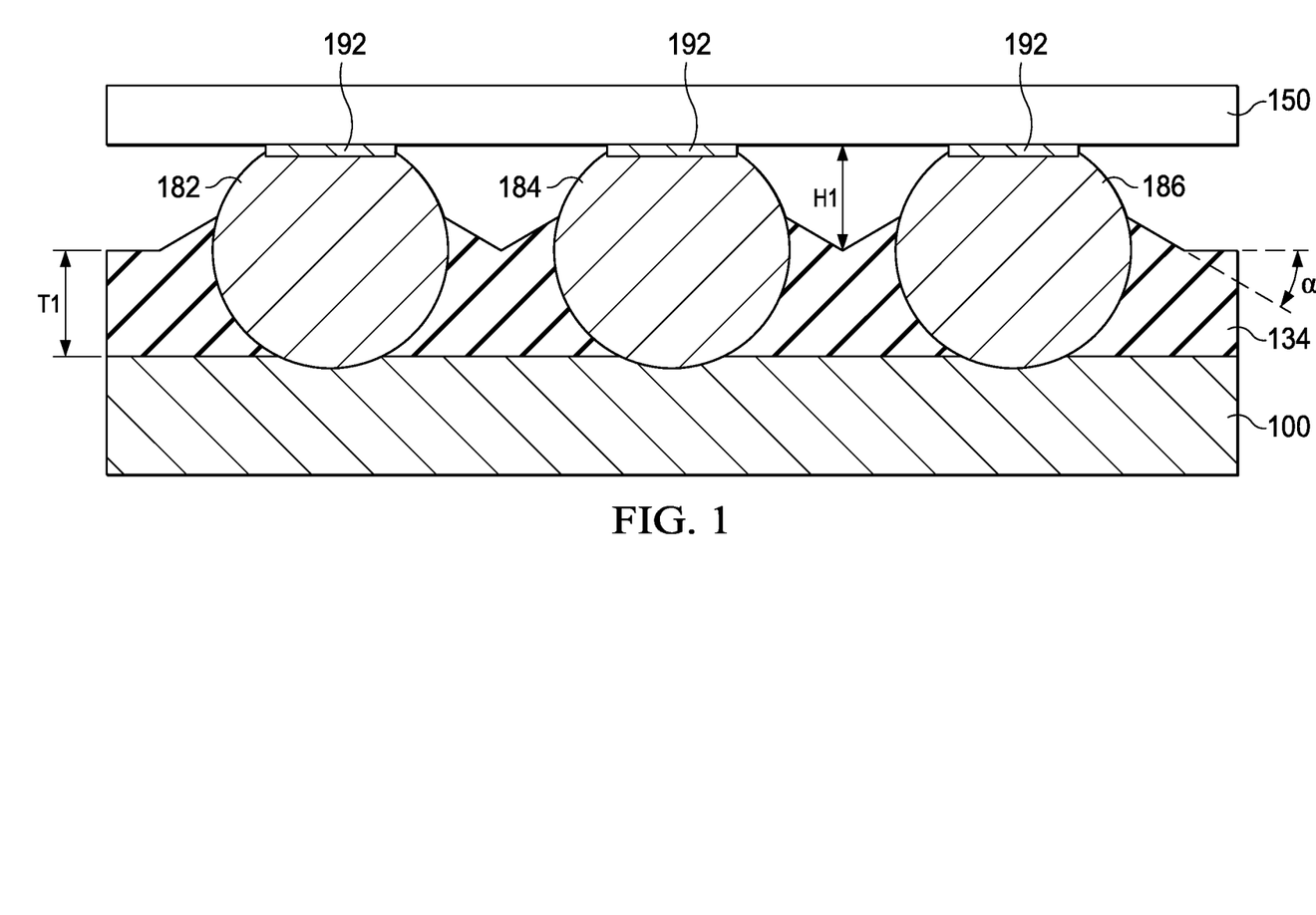
FIG. 1 illustrates a cross sectional view of a package on package (PoP) interconnect structure in accordance with an embodiment.

Referring initially to FIG. 1, a cross sectional view of a package on package (PoP) interconnect structure is illustrated in accordance with an embodiment. The PoP interconnect structure may comprise a plurality of metal bumps placed between a packaging substrate 150 and a semiconductor die 100. While FIG. 1 shows the metal bumps mounted on the semiconductor die 100, the semiconductor die 100 is merely an example. A person skilled in the art will recognize that the PoP interconnect structure is applicable to interposers, interposers for wafer level chip scale packaging and the like.

As shown in FIG. 1, three metal bumps 182, 184 and 186 are placed between the packaging substrate 150 and the semiconductor die 100. More particularly, the metal bumps (e.g., 182) are coupled to the packaging substrate 150 through a plurality of bump pads (e.g., bump pad 192). A liquid molding compound layer 134 is formed over the semiconductor die 100. In particular, a bottom portion of the metal bump (e.g., metal bump 182) is submerged under the liquid molding compound layer 134.

The liquid molding compound layer 134 may comprise a plurality of concave meniscus regions formed between two adjacent metal bumps. As shown in FIG. 1, the distance between the packaging substrate 150 and the bottom end of the concave meniscus region is defined as H1. In accordance with an embodiment, H1 is in a range between about 5 um and about 150 um. The thickness of the liquid molding compound layer 134 is defined as T1. In accordance with an embodiment, T1 is in a range between about 50 um and about 150 um. Furthermore, in a cross section view, each concave meniscus region may comprise two triangle-shaped regions attached to two adjacent metal bumps respectively. As shown in FIG. 1, each triangle-shaped region may have an angle a in a range from 10 degrees to 50 degrees.

Figure 2:
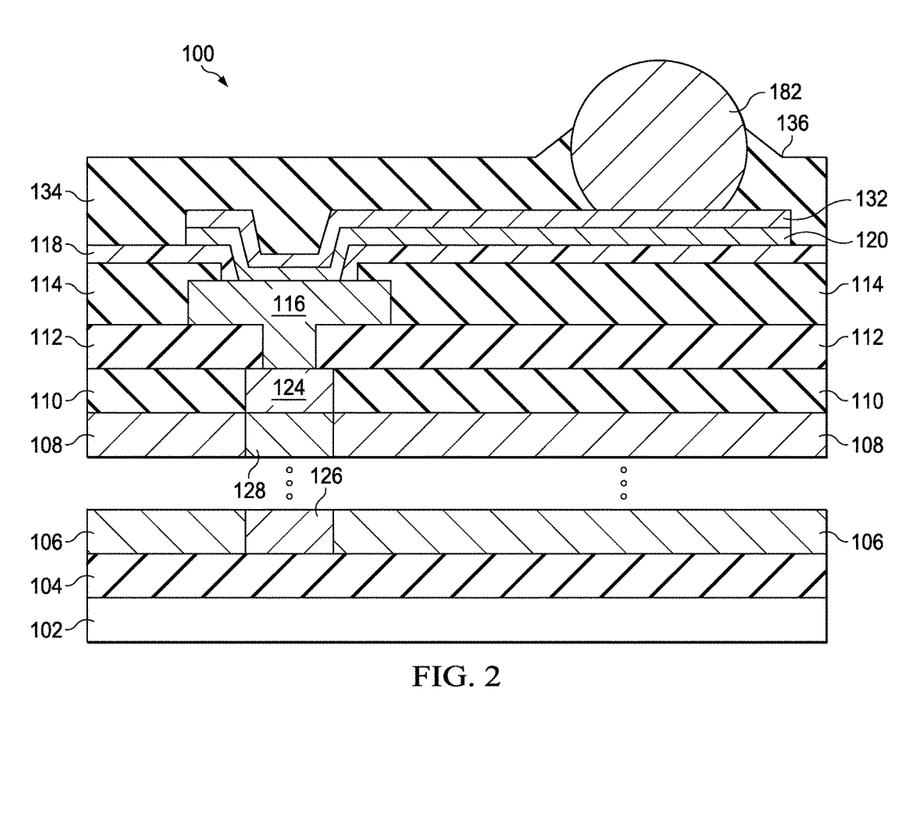
FIG. 2 illustrates a cross section view of a semiconductor die having a PoP interconnect structure in accordance with an embodiment.

FIG. 2 illustrates a cross section view of a semiconductor die having a PoP interconnect structure in accordance with an embodiment. As shown in FIG. 2, the PoP interconnect structure is formed on a semiconductor die 100. The semiconductor die 100 comprises a substrate 102. The substrate 102 may be a silicon substrate. Alternatively, the substrate 102 may be a silicon-on-insulator substrate. The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 1A, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 2 shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extremely low-k dielectric material) and conductive materials (e.g., copper).

A dielectric layer 110 is formed on top of the top metallization layer 108. As shown in FIG. 2, a top metal connector 124 is embedded in the dielectric layer 110. In particular, the top metal connector provides a conductive channel between the metal line 128 and the electrical connection structure of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and the like.

A first passivation layer 112 is formed on top of the dielectric layer 110. In accordance with an embodiment, the first passivation layer 112 is formed of non-organic materials such as un-doped silicate glass, silicon nitride, silicon oxide and the like. Alternatively, the first passivation layer 112 may be formed of low-k dielectric such as carbon doped oxide and the like. In addition, extremely low-k (ELK) dielectrics such as porous carbon doped silicon dioxide can be employed to form the first passivation layer 112. The first passivation layer 112 may be formed through any suitable techniques such as CVD. As shown in FIG. 2, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 2, a bond pad 116 is formed in the openings of the first passivation and second passivation layers. In accordance with an embodiment, the bond pad 116 may be formed of aluminum. For simplicity, throughout the description, the bond pad 116 may be alternatively referred to as an aluminum pad 116.

The aluminum pad 116 may be enclosed by the first and second passivation layers 112 and 114. In particular, a bottom portion of the aluminum pad 116 is embedded in the first passivation layer 112 and a top portion of the aluminum pad 116 is embedded in the second passivation layer 114. The first and second passivation layers 112 and 114 overlap and seal the edges of the aluminum pad 116 so as to improve electrical stability by preventing the edges of the aluminum pad 116 from corrosion. In addition, the passivation layers may help to reduce the leakage current of the semiconductor device.

A polymer layer 118 is formed on top of the second passivation layer 114. The polymer layer 118 is made of polymer materials such as epoxy, polyimide and the like. In particular, the polymer layer 118 may comprise photo-definable polyimide materials such as HD4104. For simplicity, throughout the description, the polymer layer 118 may be alternatively referred to as the PI layer 118. The PI layer 118 may be made by any suitable method known in the art such as spin coating.

A seed layer 120 is formed over the PI layer 118. The seed layer 120 may comprise two portions, namely a bottom seed layer (not shown) and an upper seed layer (not shown). The bottom seed layer may be a titanium layer, a titanium nitride layer, a tantalum layer, a tantalum nitride layer or the like. The upper seed layer may be formed of copper, copper alloys or the like. In accordance with an embodiment, the seed layer 120 may be formed using any suitable techniques such as physical vapor deposition.

A post-passivation interconnect (PPI) layer 132 is formed over the seed layer 120. The PPI layer 132 may be formed of copper, copper alloys and the like. The PPI layer 132 may be formed using any suitable techniques such as electrochemical plating. Other processes of formation such as sputtering, evaporation, PECVD and the like may alternatively be used depending upon the desired materials.

A metal bump 182 is formed on top of the PPI layer 132. In accordance with an embodiment, the metal bump 182 may be a solder ball. The solder ball 182 may be made of any of suitable materials. In accordance with an embodiment, the solder ball 182 comprises SAC405. SAC405 comprises 95.5% Sn, 4.0% Ag and 0.5% Cu. For simplicity, throughout the description, the metal bump 182 may be alternatively referred to as the solder ball 182. It should be noted that the connector (e.g., solder ball 182) shown in FIG. 2 is merely an example. The disclosure is applicable to a variety of semiconductor connectors.

A liquid molding compound layer 134 is formed over the PI layer 118 and the PPI layer 132. As shown in FIG. 2, the solder ball 182 is partially covered by the liquid molding compound layer 134. More particularly, a concave meniscus molding compound corner 136 is formed between the top surface of the liquid molding compound layer 134 and the outer surface of the solder ball 182. The detailed process of forming the liquid molding compound layer 134 will be described below with respect to FIGS. 6-11.

Figure 3:
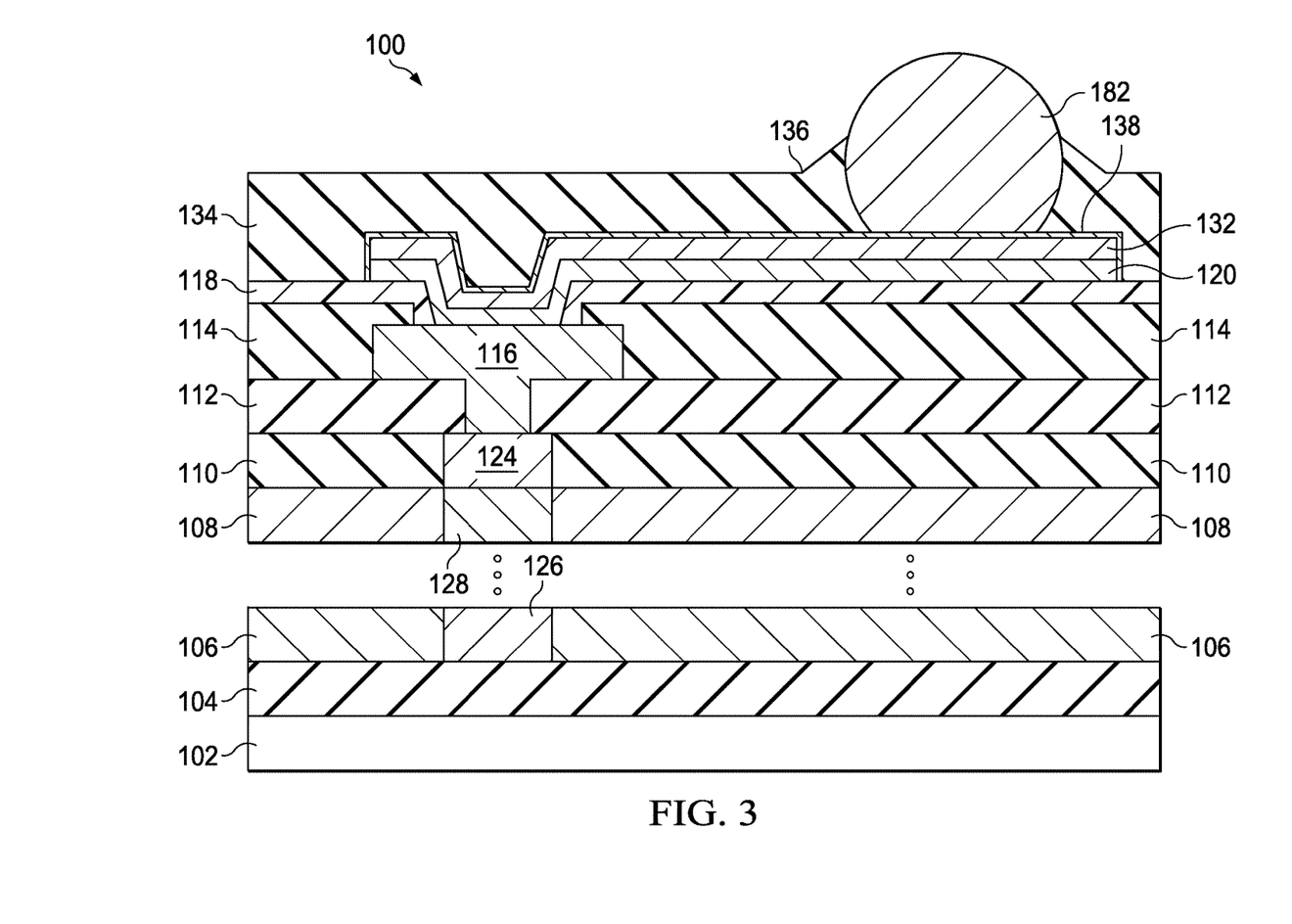
FIG. 3 illustrates a cross section view of a semiconductor die having a PoP interconnect structure in accordance with another embodiment.

FIG. 3 illustrates a cross section view of a semiconductor die having a PoP interconnect structure in accordance with another embodiment. FIG. 3 is similar to FIG. 2 except that an immersion tin layer 138 is formed over the PPI layer 132. The PPI layer 132 may be formed of copper. In order to prevent the copper layer 132 from being oxidized, an immersion tin process may be employed to provide a tin layer on top of the copper layer 132. The immersion tin layer 138 helps to improve interconnect reliability and provide better corrosion resistance.

Figure 4:
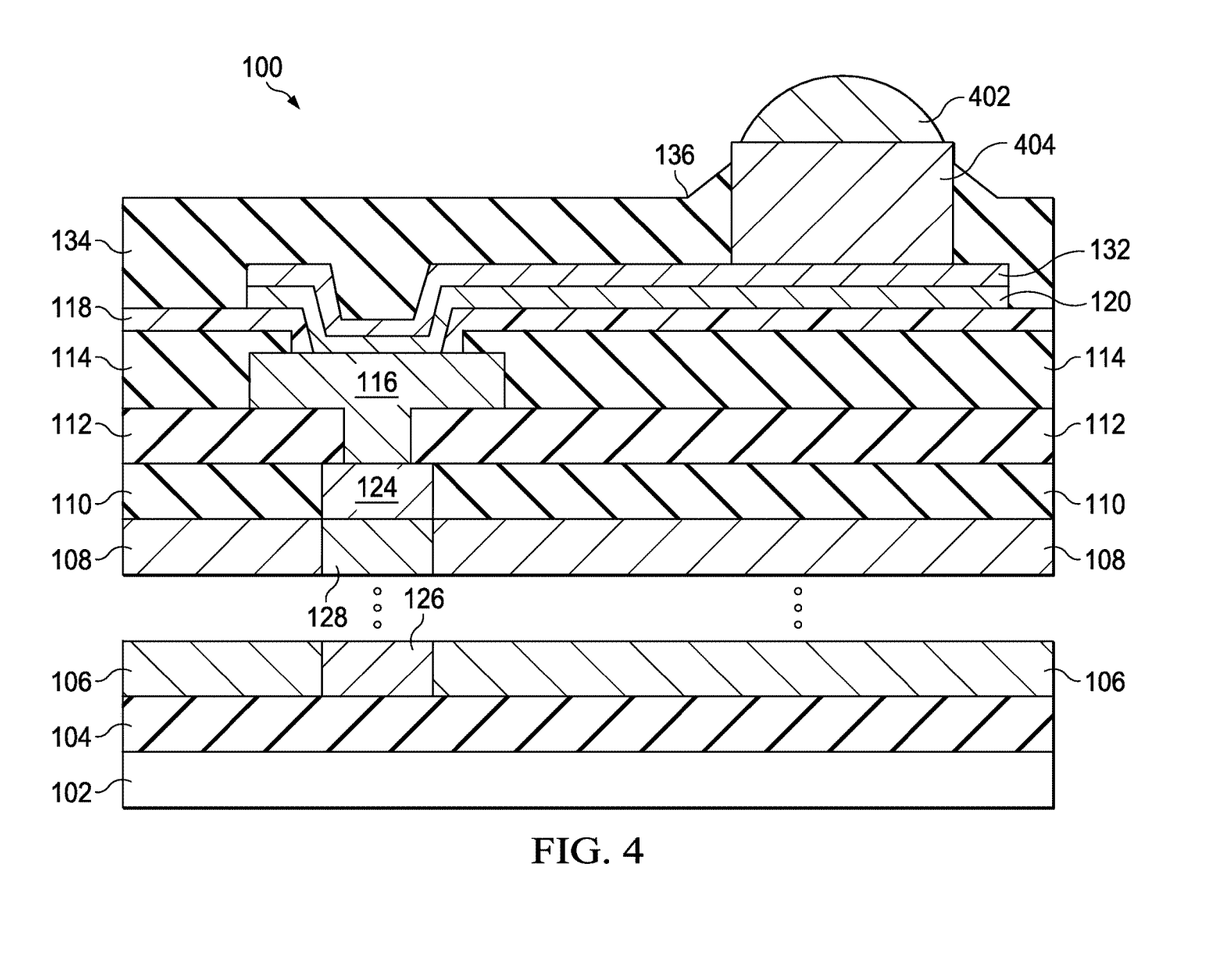
FIG. 4 illustrates a cross section view of a semiconductor die having a PoP interconnect structure in accordance with yet another embodiment.

FIG. 4 illustrates a cross section view of a semiconductor die having a PoP interconnect structure in accordance with yet another embodiment. FIG. 4 is similar to FIG. 2 except that the interconnect structure is formed by a combination of a copper pillar 404 and a solder ball 402. As shown in FIG. 4, the copper pillar 404 may be formed on the top surface of the copper PPI layer 132. As a result, the copper pillar 404 is in contact with the top surface of the PPI layer 132. The height of the copper post 404 is in a range between about 10 um and about 50 um. A solder layer (not shown) is plated over the copper pillar 404. After a reflow process, the solder layer is converted into the solder ball 402.

Figure 5:
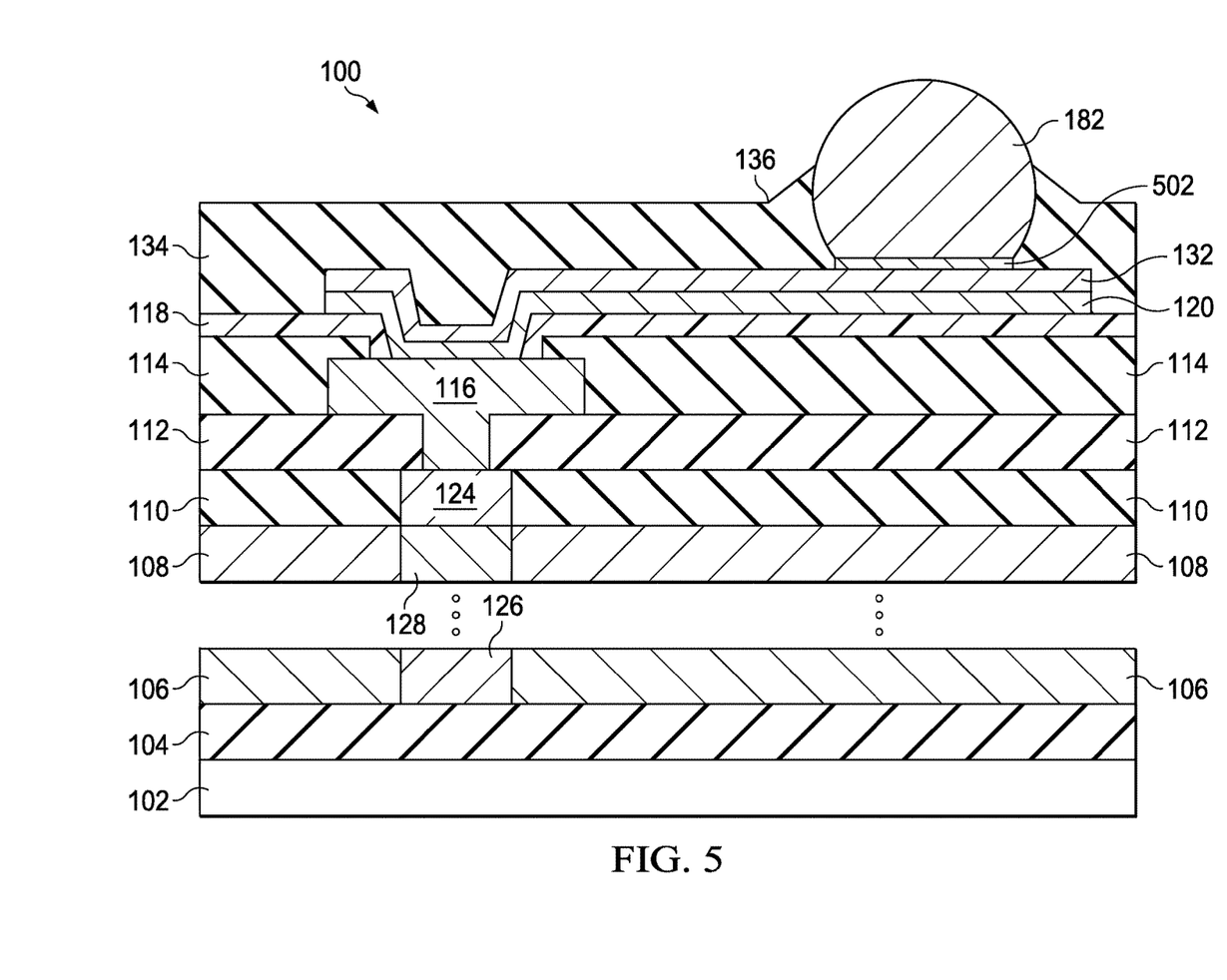
FIG. 5 illustrates a cross section view of a semiconductor die having a PoP interconnect structure in accordance with yet another embodiment.

FIG. 5 illustrates a cross section view of a semiconductor die having a PoP interconnect structure in accordance with yet another embodiment. FIG. 5 is similar to FIG. 2 except that there may be a metal bump pad 502 formed between the post passivation interconnect layer 132 and the solder ball 182. The metal bump pad 502 is formed of metal materials such as nickel, palladium and the like. In accordance with an embodiment, there may be no additional seed layer formed between the metal bump pad 502 and the post passivation interconnect layer 132. The metal bump pad 502 is formed on the post passivation interconnect layer 132 using suitable techniques such as plating.

Figure 6:
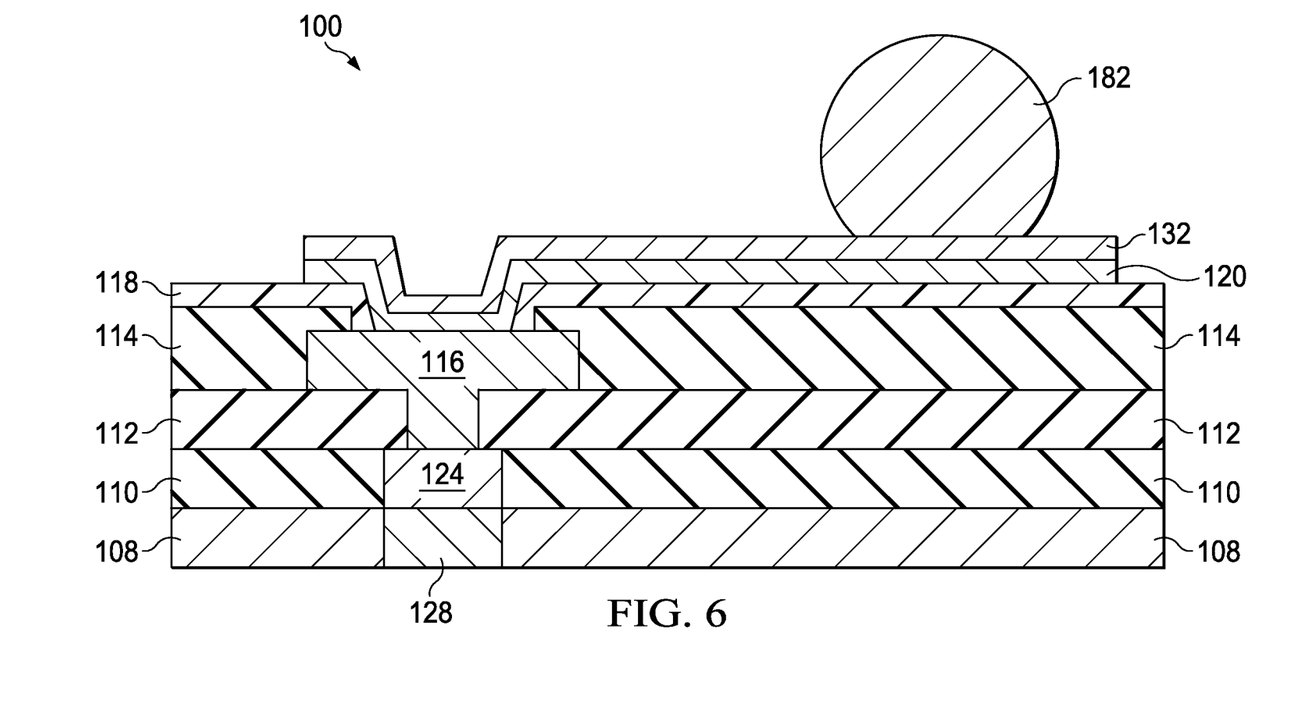
FIG. 6 illustrates an interconnection metal ball mounted on a semiconductor die in accordance with an embodiment.

FIGS. 6-11 illustrate intermediate stages of forming a liquid molding compound layer in a POP interconnect structure in accordance with an embodiment. FIG. 6 illustrates an interconnection metal ball mounted on a semiconductor die in accordance with an embodiment. As shown in FIG. 6, the solder ball 182 is mounted on the PPI layer 132. The other elements shown in FIG. 6 have been described in detail with respect to FIG. 2, and hence are not discussed herein to avoid unnecessary repetition.

Figure 7:
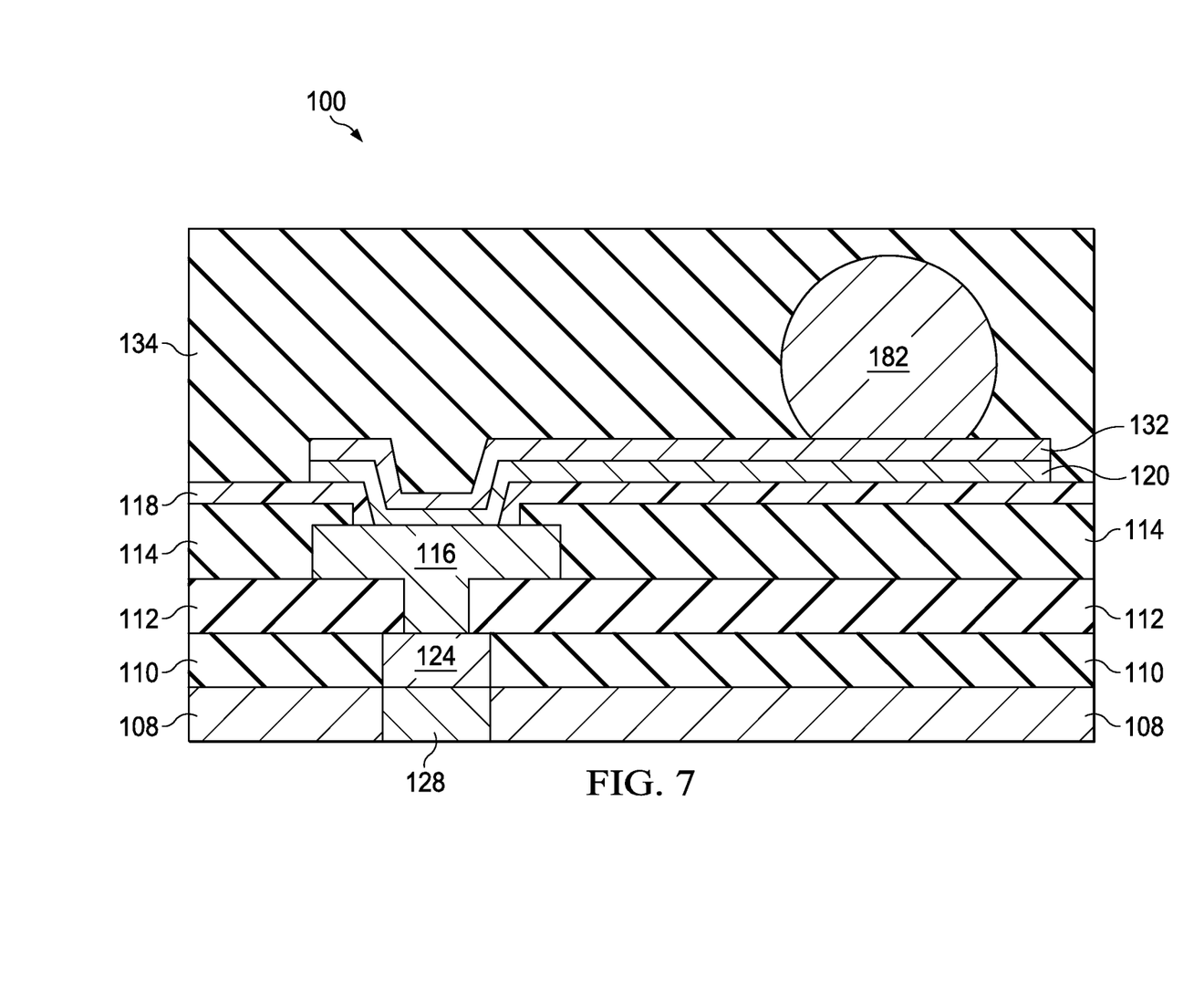
FIG. 7 illustrate a method of forming an intermediate liquid molding compound layer in accordance with an embodiment.

FIG. 7 illustrate a method of forming an intermediate liquid molding compound layer in accordance with an embodiment. As shown in FIG. 7, a liquid molding compound material is applied on the semiconductor die 100 to from a liquid molding compound layer 134. In accordance with an embodiment, the liquid molding compound material may be formed of epoxy. The interconnection metal ball 182 is embedded in the liquid molding compound layer 134.

Figure 8:
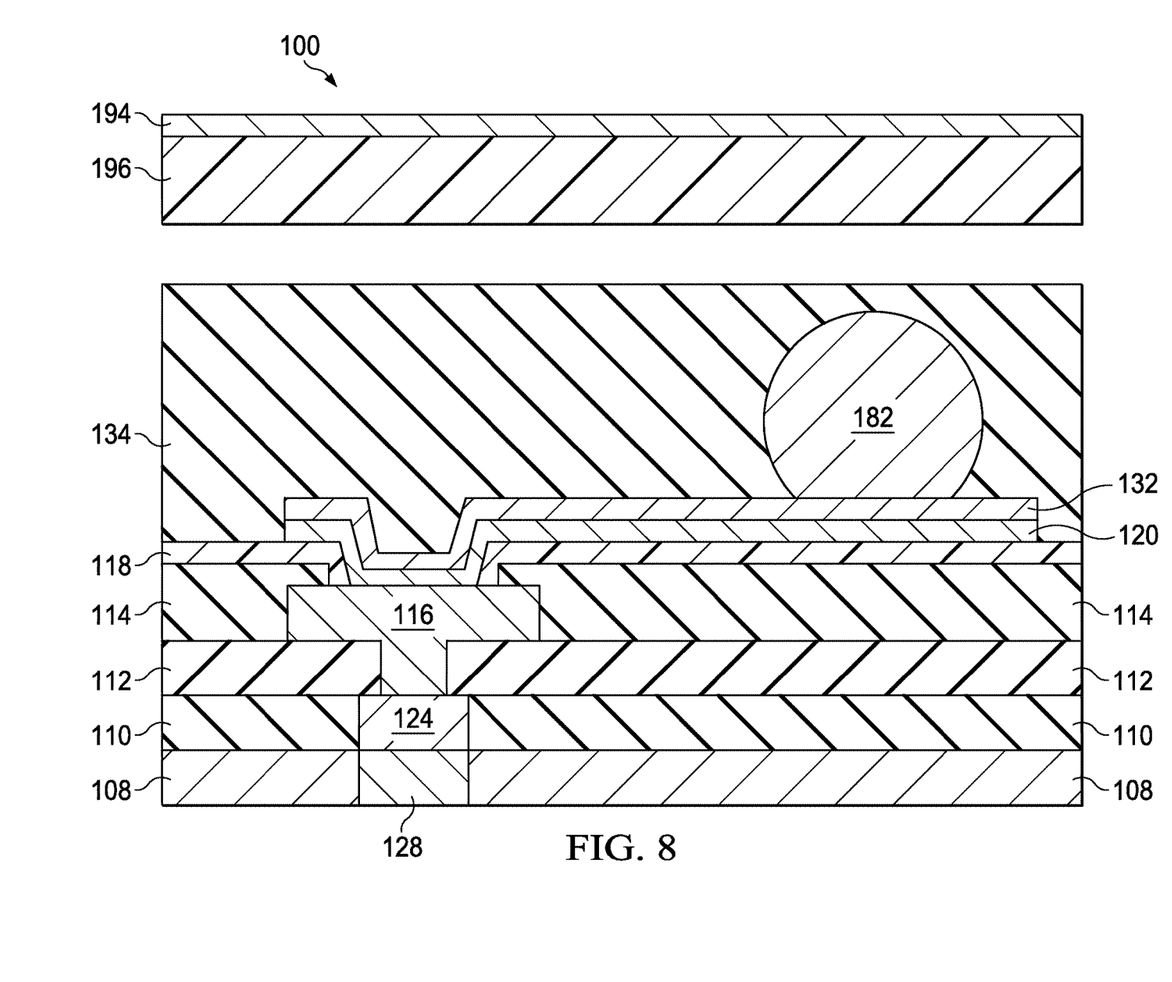
FIG. 8 illustrates a release film used for pressing the liquid molding compound layer.
Figure 9:
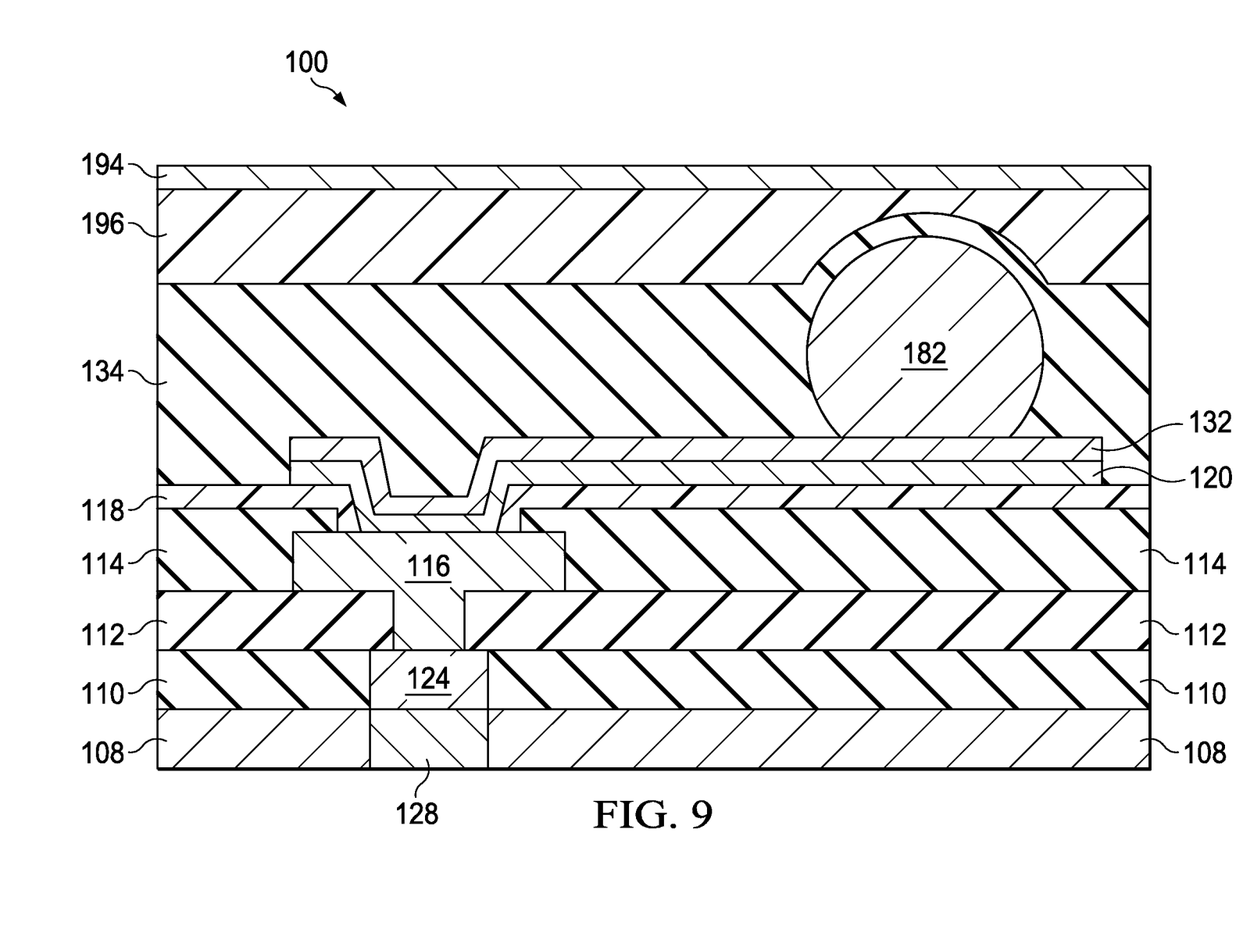
FIG. 9 illustrates a method of pressing the intermediate liquid molding compound layer to form the final liquid molding compound layer.

FIG. 8 illustrates a release film used for pressing the liquid molding compound layer. The release film 196 is formed of soft materials such as Ethylene Tetrafluoroethylene (ETFE). As shown in FIG. 8, the soft material layer is attached to a metal plate 194. FIG. 9 illustrates a method of pressing the intermediate liquid molding compound layer to form the final liquid molding compound layer. As the pressure from the metal plate 194 is applied, a portion of the interconnection metal ball 182 is pressed into the release film layer 196. In addition, the release film layer 196 may push a portion of the liquid molding compound layer 134 away from the top surface of the semiconductor die 100. As a result, the bottom surface of the release film layer 196 may be lower than the top end of the solder ball 182. Meanwhile, a curing process may be applied to the liquid molding compound layer 134. Such a curing process may solidify the liquid molding compound to generate a layer in a solid form.

Figure 10:
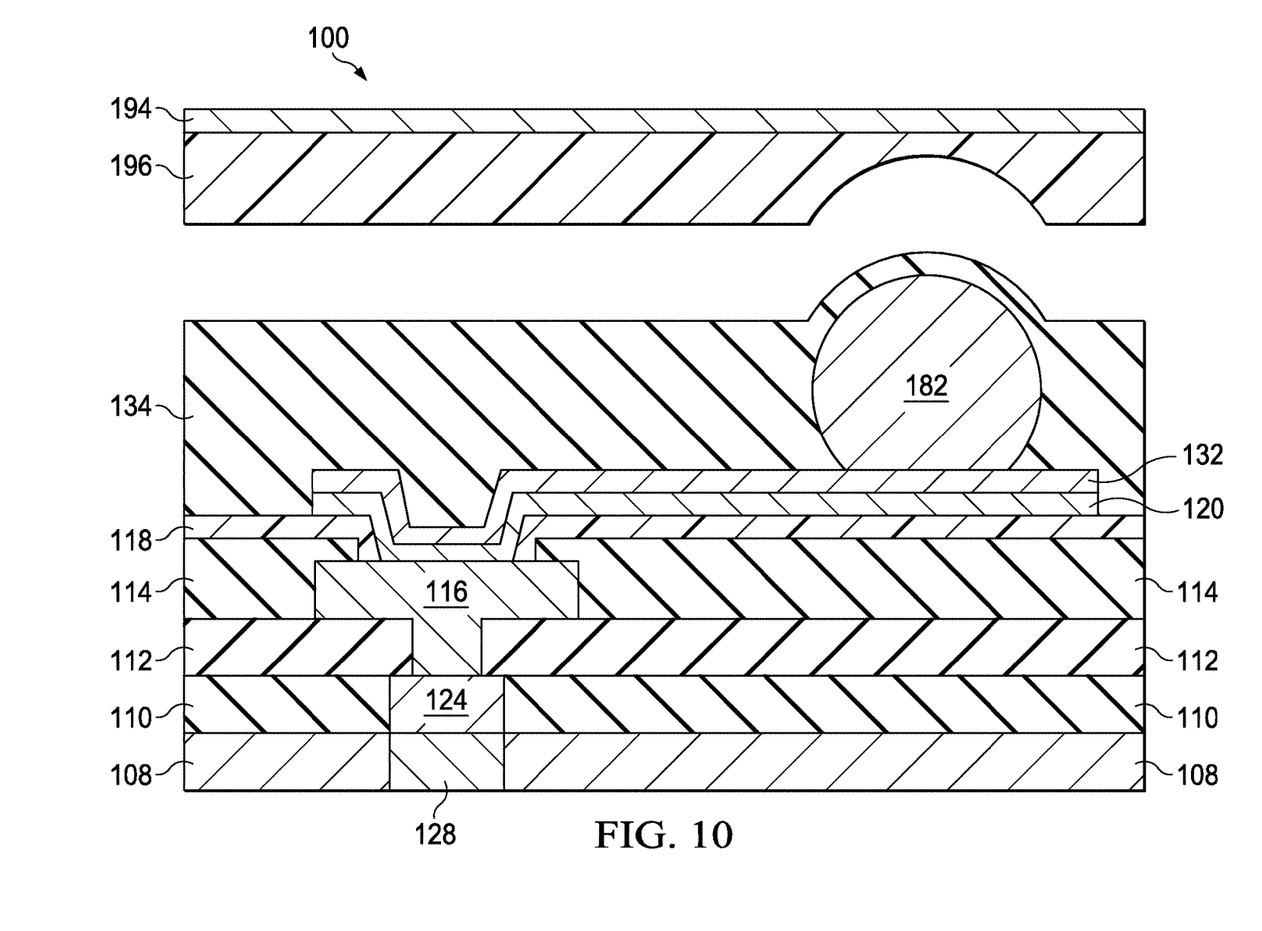
FIG. 10 illustrates a cross sectional view of the PoP interconnect structure after removing the release film in accordance with an embodiment.

FIG. 10 illustrates a cross sectional view of the PoP interconnect structure after removing the release film in accordance with an embodiment. After the release film 196 is removed from the semiconductor die 100, there may be a thin layer of molding compound residue left on the top surface of the interconnection metal ball 182. The rest portion of the liquid molding compound layer 134 is lower than the top end of the solder ball 182.

Figure 11:
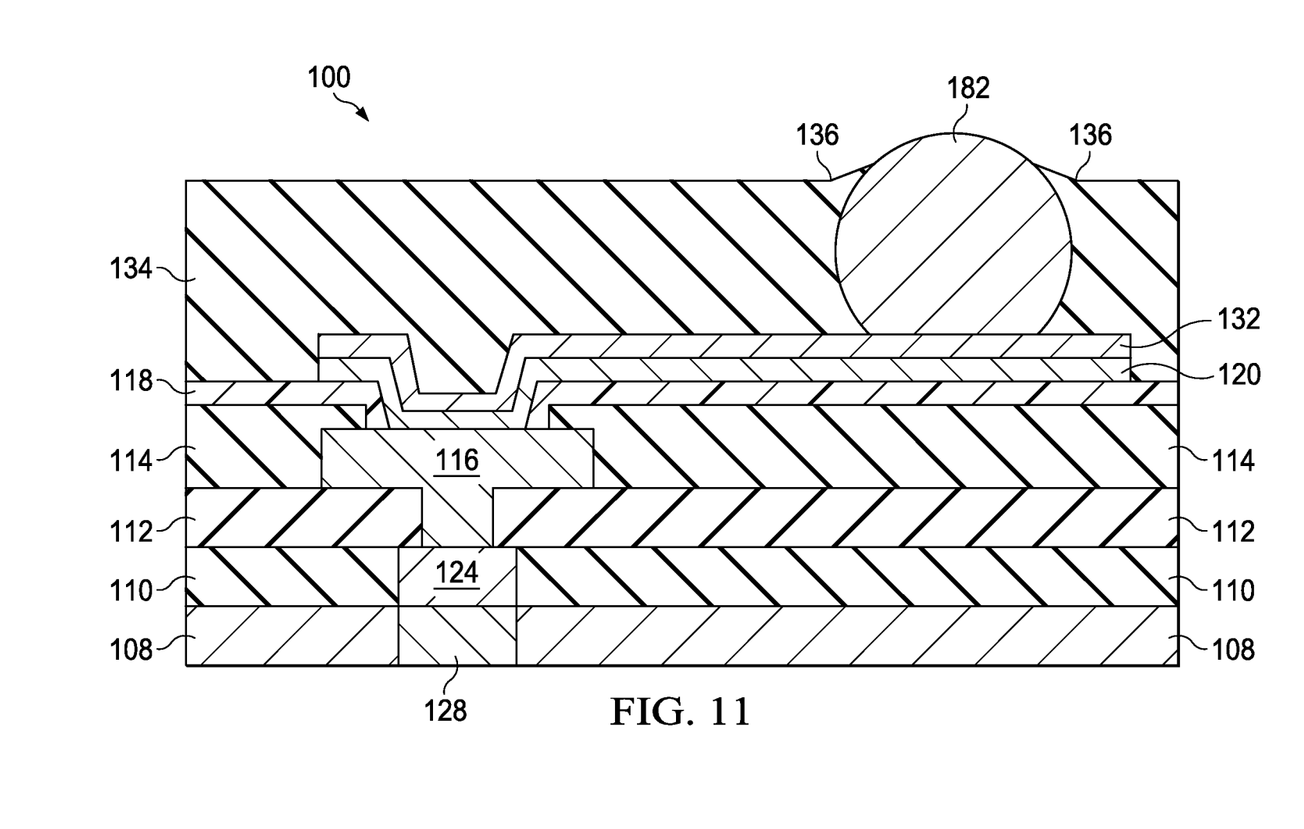
FIG. 11 illustrates a cross section view of the PoP interconnect structure after removing the molding compound residue.

FIG. 11 illustrates a cross section view of the PoP interconnect structure after removing the molding compound residue. The molding compound residue (shown in FIG. 10) on the top surface of the interconnection metal ball 182 may be removed by suitable etching techniques such as wet or plasma etching processes. A portion of the molding compound residue may stay at the corner between the outer surface of the solder ball 182 and the top surface of the liquid molding compound layer 134. As shown in FIG. 11, the remaining portion of the molding compound residue is the concave meniscus corner 136. An advantageous feature of having a concave meniscus corner surrounding the solder ball 182 is that the concave meniscus corner helps to improve the reliability of the solder ball 182.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
    a seed layer over a semiconductor substrate;
    a post passivation interconnect layer formed over the semiconductor substrate and the seed layer, the post passivation interconnect layer contacting a top surface of the seed layer;
    an immersion tin layer formed on the post passivation interconnect layer, the immersion tin layer contacting a top surface and sidewalls of the post passivation interconnect layer, the immersion tin layer contacting sidewalls of the seed layer;
    a metal bump formed on the immersion tin layer;
    a molding compound layer formed over the semiconductor substrate, wherein the immersion tin layer is embedded in the molding compound layer, wherein the immersion tin layer is directly contacting the molding compound layer, the molding compound layer comprising:
        a lower portion, wherein a lower portion of the metal bump is embedded in the lower portion of the molding compound layer; and
        a concave meniscus portion over the lower portion of the molding compound layer, wherein the concave meniscus portion surrounds a middle portion of sidewalls of the metal bump.

2. The structure of claim 1, further comprising:
    a first metal layer formed over the semiconductor substrate;
    a first dielectric layer formed on the first metal layer;
    a second metal layer formed on the first dielectric layer;
    a first passivation layer formed over the second metal layer;
    a second passivation layer formed over the first passivation layer;
    a bond pad embedded in the first passivation layer and the second passivation layer, the bond pad having a lower portion having a first width and an upper portion having a second width greater than the first width, a bottom surface of the lower portion being co-planar with a bottom surface of the first passivation layer, the upper portion extending into the second passivation layer; and
    a protection layer formed on the second passivation layer, the post passivation interconnect layer being over the protection layer and the bond pad, the seed layer contacting the bond pad through the protection layer.

3. The structure of claim 2, wherein the bond pad is an aluminum bond pad.

4. The structure of claim 2, wherein the protection layer is a polyimide layer.

5. The structure of claim 1, wherein the metal bump is a solder ball.

6. The structure of claim 1, wherein the metal bump comprises:
    a bottom metal portion formed on the post passivation interconnect layer; and
    an upper solder portion formed over the bottom metal portion.

7. The structure of claim 1, further comprising a metal bump pad formed between the metal bump and the post passivation interconnect layer.

8. The structure of claim 1, wherein the immersion tin layer is a continuous layer along the sidewalls of the seed layer and the sidewalls and the top surface of the post passivation interconnect layer, and wherein the immersion tin layer has a same thickness along its entire length.

9. A system comprising:
    a packaging substrate having a plurality of bump pads; and
    a semiconductor device coupled to the packaging substrate through a plurality of metal bumps, wherein the semiconductor device comprises:
        a semiconductor substrate;
        the plurality of metal bumps, each of which is in physical contact with an immersion tin layer on a corresponding interconnection pad, the immersion tin layers being on top surfaces and sidewalls of each of the interconnection pads, each of the interconnection pads having a seed layer interposed between the interconnection pads and the semiconductor substrate, the immersion tin layers contacting sidewalls of the seed layers, wherein the immersion tin layer is between each of the plurality of metal bumps and the corresponding interconnection pad, wherein the immersion tin layer is a continuous layer along the sidewalls of the seed layers and the sidewalls and the top surface of the interconnection pads, and wherein the immersion tin layer has a same thickness along its entire length; and
        a molding compound layer formed over the semiconductor substrate, wherein the molding compound layer comprises a concave meniscus surface between two adjacent metal bumps, wherein a first angle is formed by the concave meniscus surface of the molding compound layer proximate a metal bump and a plane parallel to a major surface of the semiconductor substrate, the first angle being in a range from about 10 degrees to about 50 degrees.

10. The system of claim 9, further comprising:
    a first metal layer formed over the semiconductor substrate;
    a first dielectric layer formed on the first metal layer;
    a second metal layer formed on the first dielectric layer;
    a first passivation layer formed over the second metal layer;
    a second passivation layer formed over the first passivation layer;
    a bond pad embedded in the first passivation layer and the second passivation layer, the bond pad extending through the first passivation layer and extending at least partially through the second passivation layer; and
    a protection layer formed on the second passivation layer, the seed layer being on the protection layer and contacting the bond pad through the protection layer.

11. The system of claim 10, wherein:
    the bond pad is an aluminum bond pad; and
    the protection layer is a polyimide layer.

12. The system of claim 9, wherein the molding compound layer is of a thickness in a range between about 50 um and about 150 um.

13. The system of claim 9, wherein a distance between the molding compound layer and the package substrate is in a range between about 5 um and 150 um.

14. The system of claim 9, wherein the concave meniscus surface of the molding compound layer has a triangle shape in a cross section view.

15. A device comprising:
a first metal layer formed over a first substrate;
a first dielectric layer formed on the first metal layer;
a second metal layer formed on the first dielectric layer;
a first passivation layer formed over the second metal layer;
a second passivation layer formed over the first passivation layer;
a bond pad embedded in the first passivation layer and the second passivation layer, the bond pad having a first portion having a first width and a second portion over the first portion, the second portion having a second width, the second width being greater than the first width, the first portion extending through the first passivation layer, and the second portion extending into the second passivation layer; and
a protection layer formed on the second passivation layer;
a seed layer formed over the protection layer and the bond pad, the seed layer contacting the bond pad;
a post passivation interconnect (PPI) over the seed layer, the protection layer, and the bond pad, the post passivation interconnect contacting the seed layer, the seed layer being interposed between the protection layer and the PPI, the seed layer being interposed between the bond pad and the PPI;
an immersion tin layer contacting a top surface and sidewalls of the PPI, the immersion tin layer contacting sidewalls of the seed layer;
a conductive connector on a top surface of the immersion tin layer;
a molding compound over the top surface of the PPI and surrounding at least a portion of the conductive connector, the molding compound having a concave top surface adjoining and surrounding the conductive connector, the molding compound contacting the top surface and sidewalls of the immersion tin layer; and
a second substrate coupled to the first substrate through the conductive connector.

16. The device of claim 15, wherein the concave top surface of the molding compound has a triangle shape in a cross section view.

17. The device of claim 15, wherein a distance between the top surface of the molding compound and a surface of the second substrate is in a range from about 5 um to about 150 um.

* * * * *